US010439578B1

United States Patent
Arunachalam

(10) Patent No.: US 10,439,578 B1
(45) Date of Patent: Oct. 8, 2019

(54) SMART SPEAKERS WITH CLOUD EQUALIZER

(71) Applicant: Harman International Industries, Incorporated, Stamford, CT (US)

(72) Inventor: Srinath Arunachalam, West Jordan, UT (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 15/922,839

(22) Filed: Mar. 15, 2018

(51) Int. Cl.
| | |
|---|---|
| H03G 3/10 | (2006.01) |
| H04B 3/00 | (2006.01) |
| H03G 5/16 | (2006.01) |
| H04R 3/12 | (2006.01) |
| H04R 27/00 | (2006.01) |
| G06F 16/68 | (2019.01) |

(52) U.S. Cl.
CPC ............. *H03G 5/165* (2013.01); *G06F 16/68* (2019.01); *H04R 3/12* (2013.01); *H04R 27/00* (2013.01); *G10H 2210/036* (2013.01); *H04R 2227/003* (2013.01)

(58) Field of Classification Search
CPC ... H03G 5/165; G06F 16/68; G10H 2210/036
USPC .......................................... 381/103, 107, 77
See application file for complete search history.

(56) References Cited

U.S. PATENT DOCUMENTS

| | | | |
|---|---|---|---|
| 2009/0290725 | A1 | 11/2009 | Huang |
| 2014/0270235 | A1 | 9/2014 | Shin et al. |
| 2016/0337614 | A1 | 11/2016 | Siminoff et al. |
| 2018/0035209 | A1* | 2/2018 | Triplett ............ H04N 21/23406 |

FOREIGN PATENT DOCUMENTS

EP     2779689 A1     9/2014

OTHER PUBLICATIONS

Anonymous, "Audio Fingerprinting—How We Identifiy Songs—That Thing We Do", Mar. 1, 2018. XP055598604, Retrieved from the Internet: URL:https://www.bmat.com/blog/2018/03/01/how-we-identify-songs-audio-fingerprinting/ [retrieved on Jun. 21, 2019] section "Audio fingerprinting".
Cisco. "Real-Time Traffic over WLAN Quality of Service"; Real-Time Traffic over Wireless LAN Solution Reference Network Design Guide, Feb. 6, 2014, pp. 1-32.

* cited by examiner

Primary Examiner — William J Deane, Jr.
(74) Attorney, Agent, or Firm — Angela M. Brunetti

(57) ABSTRACT

A cloud-based equalizer system for a plurality of smart speakers. Each speaker has a wireless range extender connecting to a wireless access point to directly send and receive data, including audio packet transmissions, to and from the cloud. Equalizer settings associated with the audio packet transmissions are retrieved from a cloud-based search and are communicated to and implemented by at least one of the speakers in the plurality of smart speakers. A wireless communication protocol prioritizes audio packet transmissions over other data that may be transmitted to and from each speaker.

20 Claims, 4 Drawing Sheets

SMART SPEAKERS WITH CLOUD EQUALIZER

TECHNICAL FIELD

The present disclosure is directed to a smart speaker and more particularly to a smart speaker capable of sending and receiving data directly to and from cloud-based storage and processing, hereinafter, the cloud, by way of a broadband connection.

BACKGROUND

A smart speaker is typically a wireless speaker that connects to a wireless access point (WAP) and offers interactive actions to control playback of audio and to control home automation devices. Smart speakers typically need to be within a range of the WAP. In the event the WAP does not provide sufficient range, such as in large homes, smart speakers in rooms outside of the range of the WAP will not have connection.

Even smart speakers that are within range of the WAP depend upon a controller application that controls, by way of a smart device such as a mobile phone or tablet, the smart speaker and its connection to the WAP. Smart speakers with a controller application do not communicate directly with the Internet through the WAP. Further, because the smart speakers are routed through the controller application any tuning of the speaker is manually performed by way of the controller application.

There is a need for a smart speaker that has the capability to extend connection to a WAP providing broadband connection capability, such as an Internet connection, in areas that would otherwise be inaccessible to the Internet while, at the same time, preserving the fidelity and performance of wireless audio streaming at the smart speaker.

SUMMARY

Each smart speaker in a plurality of smart speakers has a wireless range extender and the ability to send data to and receive data directly from a cloud-based processor, hereinafter the cloud, which may be applied to enriching a listener's listening experience through analytics and tools that are customized by cloud-based computing based on the data sent to and received from the cloud. Although the smart speakers described in the present disclosure have the ability to route Internet protocol traffic, the smart speaker's main purpose is to play audio, therefore, IP packets may be routed with a best effort traffic management in which priority is given to audio packets.

For audio playback of a song that has a particular genre identified as a tag in the digital audio tile, the tag is communicated directly by the smart speaker to a cloud-based processor. The cloud-based processor then responds to the smart speaker by sending equalizer settings that are optimal for the particular genre directly to the smart speaker. The equalizer settings may then be implemented directly at the smart speaker.

For audio playback of a song that does not have a particular genre identified, the speaker directly communicates a title of the song and a portion of the audio (i.e., a few seconds of the song) to the cloud. A search for the acoustic fingerprint is performed in the cloud. When a genre for the song is identified from the song title and portion of the audio, equalizer settings may be communicated back to the smart speaker from the cloud. In the event the song is not identified, the portion of the audio signal may be analyzed to determine suggested equalizer settings which are then communicated directly to the smart speaker.

The direct connection of the smart speakers allows data to be sent to the cloud for collection and analysis. The data that may be sent includes, but is not limited to, a genre of music, an artist, the day and time a particular song is being played. Analysis of the collected data determines listener suggestions that are then communicated directly to and implemented at the smart speaker.

Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

DETAILED DESCRIPTION

While various aspects of the present disclosure are described with reference to a particular illustrative embodiment, the present disclosure is not limited to such embodiments, and additional modifications, applications, and embodiments may be implemented without departing from the present disclosure. In the figures, like reference numbers will be used to illustrate the same components. Those skilled in the art will recognize that the various components set forth herein may be altered without varying from the scope of the present disclosure.

Any one or more of the servers, receivers, or devices described herein include computer executable instructions that may be compiled or interpreted from computer programs created using a variety of programming languages and/or technologies. In general, a processor (such as a microprocessor) receives instructions, for example from a memory, a computer-readable medium, or the like, and executes the instructions. A processing unit includes a non-transitory computer-readable storage medium capable of executing instructions of a software program. The computer readable storage medium may be, but is not limited to, an electronic storage device, a magnetic storage device, an optical storage device, an electromagnetic storage device, a semi-conductor storage device, or any suitable combination thereof. Any one or more the devices herein may rely on firmware, which may require updates from time to time to ensure compatibility with operating systems, improvements and additional functionality, security updates or the like. Connecting and networking servers, receivers or devices may include, but are not limited to, SATA, Wi-Fi, lightning, Ethernet, UFS, 5G, etc. One or more servers, receivers, or devices may operate using a dedicated operating system, multiple software programs and/or platforms for interfaces such as graphics, audio, wireless networking, enabling applications, integrating hardware of vehicle components, systems, and external devices such as smart phones, tablets, and other systems to name just a few.

Figure 1:
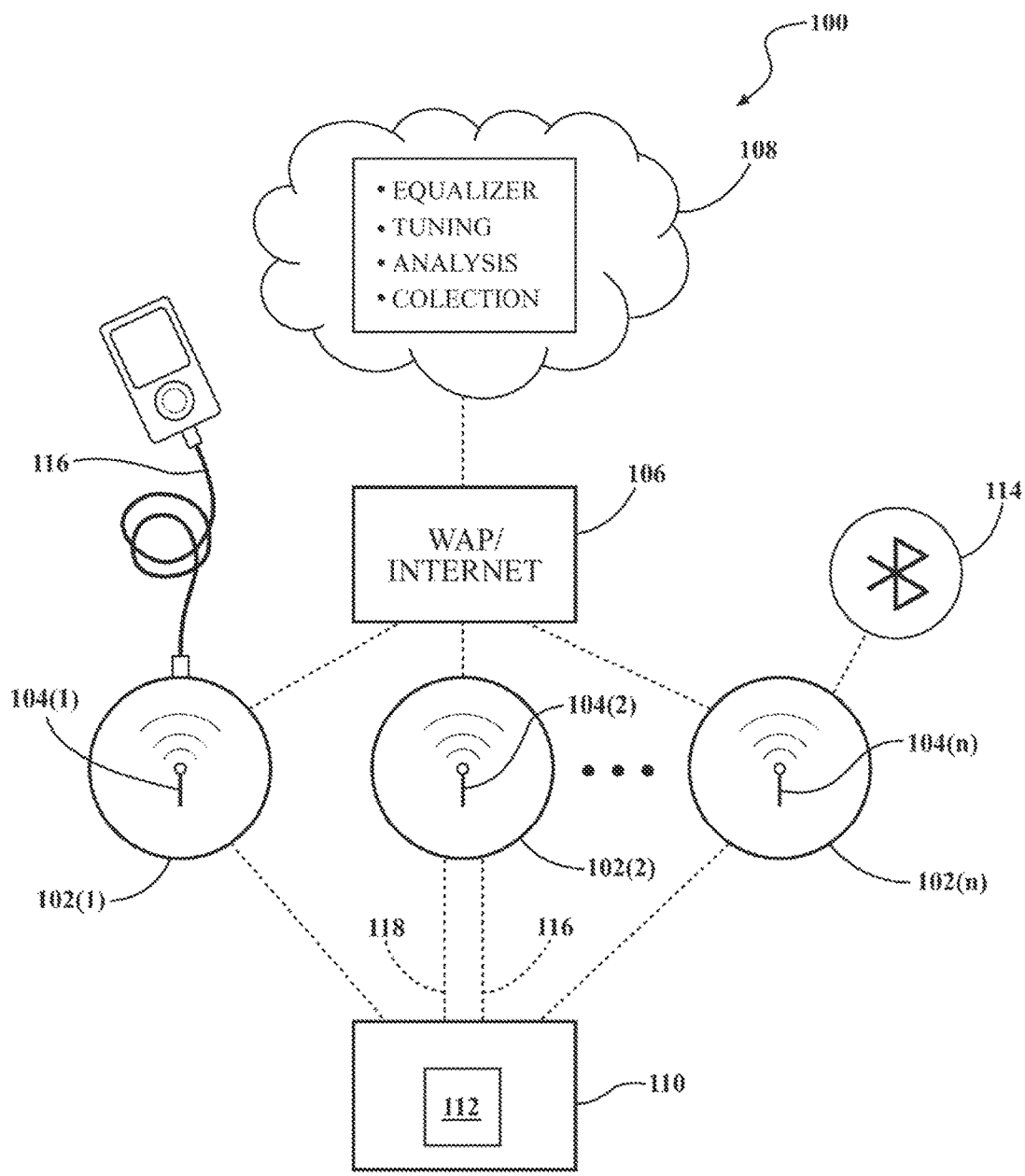
FIG. 1 is a system diagram for a plurality of smart speakers having extender capability to a wireless access point for broadband connectivity.

FIG. 1 is a system diagram 100 for a plurality of smart speakers 102(1)-(n), each having a wireless range extender 104(1)-(n) and each being connected to a wireless access point 106 and broadband connectivity, such as an Internet connection. The wireless access point 106 is a hardware device and may also be a smart device, such as a tablet or mobile phone with tethering capability. The connection to the Internet provides access to cloud-based storage and processing, referred to herein as a cloud 108. A smart device 110, such as a mobile phone, tablet, or personal computer, is equipped with a controller application 112 may also be in communication with at least one of the smart speakers in the plurality of smart speakers 102(1)-(n). The wireless range extender 104(1)-(n) may be capable of transmitting and receiving data using, for example, a wireless protocol such as WiFi (IEEE 802.11). Each smart speaker 102(1)-(n) has the capability to communicate with the cloud 108 directly instead of having to be routed through the controller application 112 on the smart device 110. At the same time, each smart speaker 102(1)-(n) extends the range of the wireless access point 106.

Each smart speaker 102(1)-(n) has the ability to send data to and receive data directly from the cloud which may be applied to enriching a listener's listening experience through analytics and tools customized based on the data. For example, in a scenario where the smart device 110 is a laptop connected for the smart speaker 102(2), the listener may be sending and receiving audio data 116 as well as accessing Internet URL's 118. Although the smart speakers 102(1)-(n) have the ability to route Internet protocol traffic, the smart speaker's main purpose is to play audio, therefore, IP packets are routed in a best effort traffic management in which priority is given to audio packets.

Wireless Media Extensions (WME) is a Wi-Fi Alliance interoperability certification based on IEEE 802.11(e) and may be used to assign priority to audio packets. This protocol defines access categories that are used by WME defined stations. Access categories are: 1) Voice (AC_VO), 2) Video (AC_VI), 3) Best Effort (AC_BE), and 4) Background (AC_BG). The audio being played on the speakers is transmitted using AC_VO and IP packets are transmitted as AC_BE category traffic in order to give audio packets higher priority and necessary bandwidth. With this transmission strategy the IP traffic won't degrade the quality of audio streaming. When there are no audio packets to stream, the IP packets may be assigned higher priority.

As discussed above, each smart speaker 102(1)-(n) has the direct ability to send and receive data from the cloud. The computational power available via cloud processing capability may be applied to collecting and analyzing data that is being sent from the speaker to the cloud. For example, transmitting metadata from digital audio, analyzing the audio being played at a particular smart speaker and applying a customized equalizer setting to enhance a listener's listening experience.

When the smart speakers 104(1)-(n) are generally subject to a setup process. The setup process enables playback of digital audio at the smart speakers 102(1)-(n). During the setup process, the listener may select an option for automatic equalization which will allow the cloud-based equalizer settings to be applied to a smart speaker without intervention by the listener. Audio may also be played from a source that is connected to the smart speaker by way of the controller application 112. Alternatively, connection to the speaker may be by Bluetooth 114 connection, or a direct hard wire Line-In 116 from a source to a smart speaker 102(1)-(n).

Digital audio typically has an acoustic fingerprint, which is a condensed digital summary that is part of the audio signal. The acoustic fingerprint may be used to identify the genre of the song, which then determines the equalizer settings most appropriate for playback. For example, a song having a rock genre will sound best with equalizer settings that enhance rock music. A song having a country genre will sound best with equalizer settings that enhance country music, which equalizer settings are different than the equalizer settings for rock music.

Figure 2:
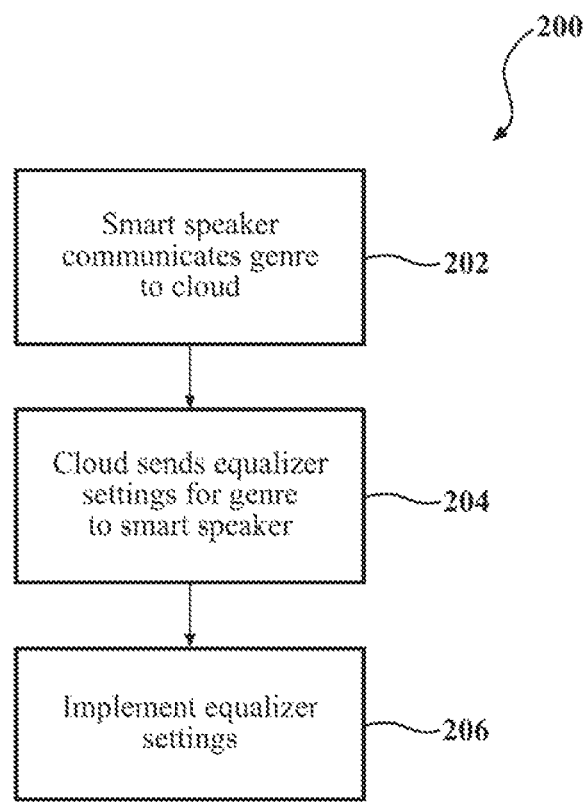
FIG. 2 is a flowchart of a method for applying cloud-based equalizer settings for audio playback.

Referring now to FIG. 2, a method 200 for cloud-based equalizer settings for audio is shown for audio playback of a song that has a particular genre identified as a tag in the digital audio file. When the genre is known, the tag is communicated 202 directly by the smart speaker to a cloud-based processor. The cloud-based processor then responds to the smart speaker by sending 204 equalizer settings that are optimal for the particular genre directly to the smart speaker. The equalizer settings may then be implemented 206 at the smart speaker.

Figure 3:
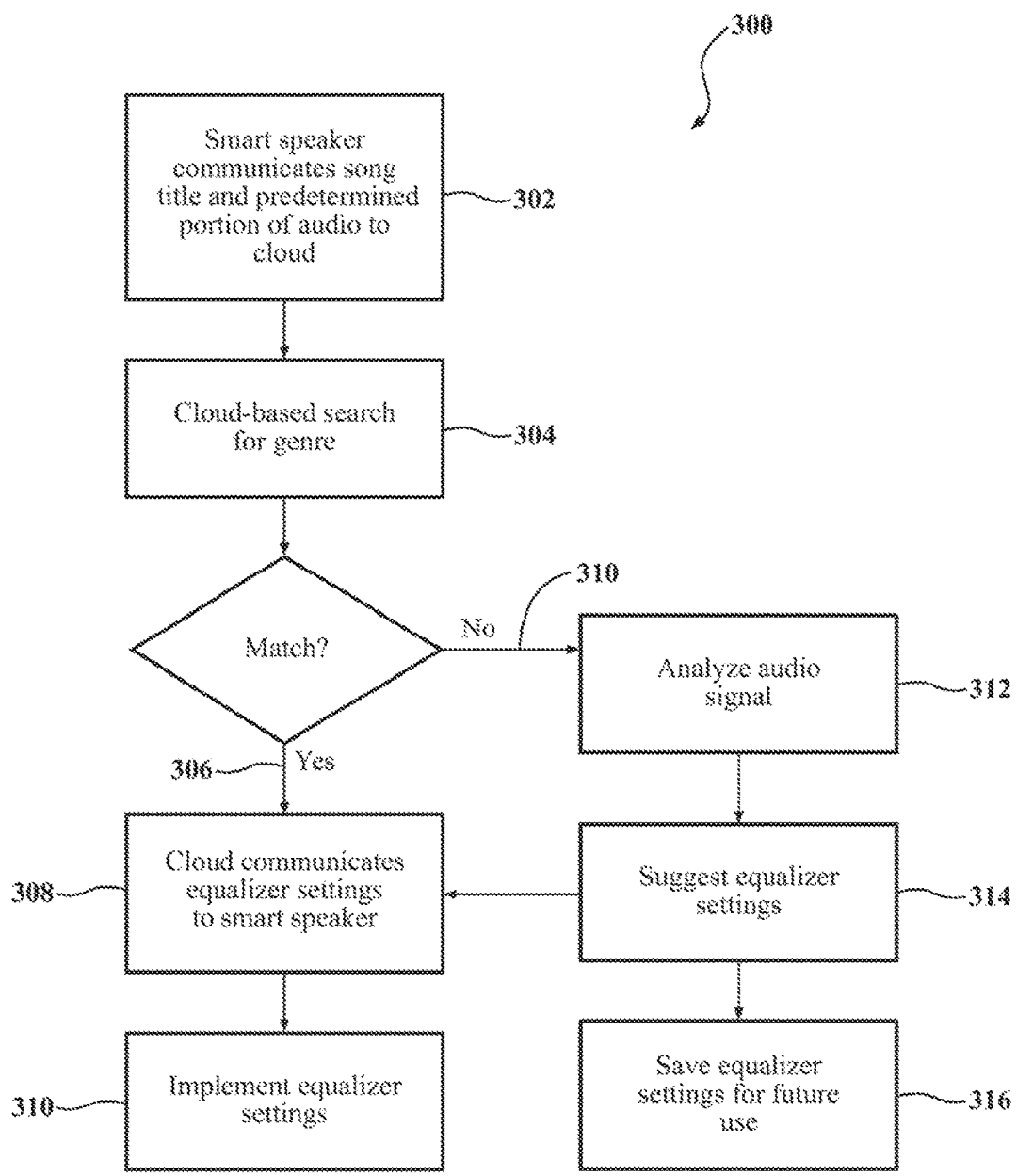
FIG. 3 is a block diagram of a cloud equalizer.

Referring now to FIG. 3, a method 300 for cloud-based equalizer settings for audio is shown for audio playback of a song that does not have a particular genre identified. This method is also applicable in instances where music tiles are being played at the smart speaker from a source other than the controller application, such as Bluetooth or Line-in. The speaker is connected directly to the cloud and communicates 302 a title of the song and a portion of the audio (i.e., a few seconds of the song) to the cloud. A search 304, in the cloud, for the acoustic fingerprint is performed. A match occurs when a genre for the song is identified 306 and equalizer settings may be communicated 308 back to the smart speaker from the cloud. In the event a match does not occur 310, the audio signal may be analyzed 312 and suggested equalizer settings may be determined 314.

The suggested equalizer settings may be communicated 308 from the cloud to the smart speaker. The suggested equalizer settings may be implemented 310 at the smart speaker. However, due to the time that it may take to perform analysis of the song, the suggested equalizer settings may be saved 316 for future reference when the song is played at a later time and in this scenario, the saved equalizer settings will result in a match 306 when the cloud-based search is performed at the later time.

The communication of data from the speaker to the cloud and from the cloud back to the speaker may extend beyond genre related data. For example, data and information about listener preferences may be sent to the cloud. If it is known that a particular listener prefers more bass or more treble, based on settings and adjustments made to equalizer settings for songs being played, the smart speaker may incorporate those preferences into the suggested equalizer settings. Referring to FIG. 3, samples of audio are played for the listener, listener preferences for each sample of audio are stored. At the step of implementing equalizer settings 310, equalizer settings sent from the cloud may be compared with the stored listener preferences and the stored listener preferences may be used to modify the equalizer settings that were received from the cloud for each genre.

Figure 4:
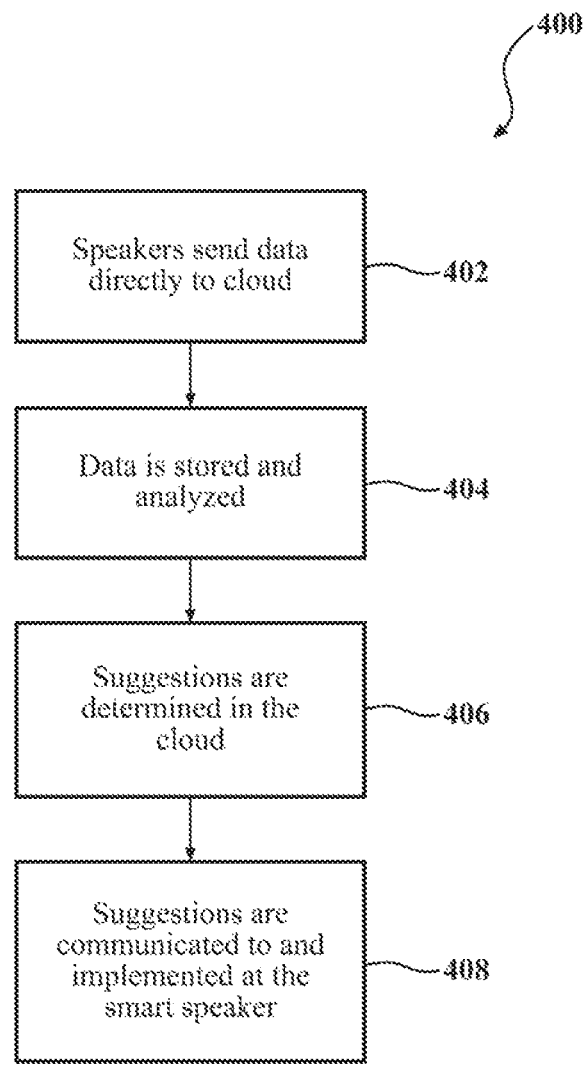
FIG. 4 is a flowchart of a method for data collection and analysis.

The speakers directly interact with the cloud. Because of this direct interaction, the speakers are capable of bypassing the controller application 112 and send data directly to the cloud. Referring to FIG. 4 a flowchart for a method 400 for data collection and mining is described. According to the method 400, the speakers send data 402 to the cloud. Some examples of useful data that may be collected and sent includes, but is not limited to, a genre of music, an artist, the day and time a particular song is being played. The sent data is stored and analyzed 402 in the cloud.

Analysis of the collected data determines 406 listener suggestions that are communicated 408 to the smart speaker and equalizer settings are implemented 408.

The collected data is analyzed and the suggestions may be used by a listener to personalize their experience, such as through equalization settings. In another example, the suggestions may include, but are not limited to, a notification when a new track is released by a favorite artist, songs in a listener's favorite genre, songs according to a time of day that are based on historical data sent by the speakers and stored in the cloud, or suggested playlists.

In yet another example, when two or more listeners are connected to any one smart speaker, equalizer settings may be suggested from either listener's preferences. Two, or more, different listeners may share playlists, equalizer settings and preferences with each other and the cloud. The examples and possibilities for analytics are too numerous to mention herein, but the direct communication of the speaker with the cloud and prioritization of audio data packets introduces several ways to enhance a listener experience that are based on collected data analyzed in the cloud and communicated back to listeners and their speaker systems.

In the foregoing specification, the present disclosure has been described with reference to specific exemplary embodiments. Various modifications and changes may be made, however, without departing from the scope of the present disclosure as set forth in the claims. The specification and figures are illustrative, rather than restrictive, and modifications are intended to be included within the scope of the present disclosure. Accordingly, the scope of the present disclosure should be determined by the claims and their legal equivalents rather than by merely the examples described.

For example, the steps recited in any method or process claims may be executed in any order and are not limited to the specific order presented in the claims. The components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

The terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present disclosure, in addition to those not specifically recited, may be varied or otherwise particularly adapted to specific environments, manufacturing specifications, design parameters or other operating requirements without departing from the general principles of the same.

The invention claimed is:

1. A cloud-based equalizer system for a plurality of smart speakers, the system comprising:
 a plurality of smart speakers, each speaker having a wireless range extender connecting to a wireless access point to send data to and receive data directly from a cloud, the data being sent includes a predetermined portion of a digital audio file being played by at least one of the plurality of smart speakers;
 a wireless communication protocol that prioritizes audio packet transmissions;
 at least one equalizer setting associated with the audio packet transmissions is retrieved from a cloud-based search to be communicated to and implemented by at least one of the plurality of smart speakers.

2. The system as claimed in claim 1 further comprising:
 a controller application in communication with at least one of the plurality of smart speakers, the controller application identifies a song genre of a song being played by at least one of the plurality of smart speakers and at least one smart speaker communicates the song genre in data sent to the cloud;
 the at least one equalizer setting retrieved from the cloud is associated with the identified song genre.

3. The system as claimed in claim 1 further comprising:
 a song title and the predetermined portion of a digital audio file of the audio packet transmissions are included in data sent to the cloud by at least one of the plurality of smart speakers;
 a matching acoustic fingerprint is returned from a cloud-based search of the song title and the predetermined portion;
 a song genre is identified from the matching acoustic fingerprint; and
 the at least one equalizer setting retrieved from the cloud is associated with the identified song genre.

4. The system as claimed in claim 1 further comprising:
 a song title and the predetermined portion of a digital audio file of the audio packet transmissions are included in the data sent to the cloud by at least one of the plurality of smart speakers for analysis;
 the at least one equalizer setting retrieved from the cloud is associated with the analysis of the song title and the predetermined portion of the digital audio file.

5. The system as claimed in claim 1 further comprising listener preferences stored in the cloud wherein the at least one equalizer setting retrieved from the cloud and implemented by at least one of the plurality of smart speakers is associated with the stored listener preferences.

6. The system as claimed in claim 1 wherein the data sent to the cloud further comprises a genre of music, a song title, an artist, a time of day, a volume, listener preferences for at least one equalizer setting, or profile data associated with at least one listener, the data is collected and analyzed to determine suggestions that are sent from the cloud to at least one of the plurality of smart speakers.

7. The system as claimed in claim 6 wherein the data is collected and analyzed in the cloud to determine suggestions for the at least one listener further comprises data communicated from one or more listeners that are known to each other.

8. A method for cloud-based equalizer settings for a plurality of smart speakers, the method carried out on a device having a processing unit including a non-transitory computer-readable medium capable of executing instructions of a software program, the method comprising the steps of:
 connecting at least one smart speaker in the plurality of smart speakers to a cloud using a wireless range extender in each smart speaker for direct connection to a wireless access point with broadband connectivity;

communicating data associated with a digital audio file being played by at least one smart speaker in the plurality of smart speakers to the cloud, the data includes a predetermined portion of the digital audio file;

searching the cloud for at least one equalizer setting associated with the digital audio file;

retrieving at least one equalizer setting associated with the digital audio file; and communicating the at least one equalizer setting to the at least one smart speaker.

9. The method as claimed in claim 8 wherein the step of communicating data further comprises prioritizing audio packet transmissions using a wireless communication protocol.

10. The method as claimed in claim 8 wherein the step of communicating data associated with a digital audio file further comprises communicating a song genre and the at least one equalizer setting retrieved in the cloud is associated with the song genre.

11. The method as claimed in claim 8 wherein the step of communicating data associated with a digital audio file further comprises the steps of:

communicating a song title and the predetermined portion of the digital audio file to the cloud;

searching the cloud for a song genre associated with the song title and the predetermined portion of the digital audio; and retrieving at least one equalizer setting associated with the song genre.

12. The method as claimed in claim 8 further comprising the steps of:

storing listener preferences in the cloud;

searching the cloud for at least one equalizer setting associated with the digital audio file and stored listener preferences.

13. The method as claimed in claim 8 wherein the data sent to the data sent to the cloud further comprises a genre of music, a song title, an artist, a time of day, a volume, listener preferences for at least one equalizer setting, or profile data associated with a listener, and the method further comprises the steps of:

analyzing the data in the cloud to determine suggestions for at least one listener;

sending the suggestions from the cloud to at least one of the plurality of smart speakers.

14. The method as claimed in claim 13 wherein analyzing the data in the cloud to determine suggestions for the at least one listener further comprises data communicated from one or more listeners that are known to each other.

15. A computer-readable medium comprising a program, which, when executed by one or more processors performs an operation comprising:

connecting at least one smart speaker in a plurality of smart speakers to a cloud using a wireless range extender in each smart speaker for direct connection to a wireless access point with broadband connectivity;

communicating data associated with a digital audio file being played by at least one smart speaker in the plurality of smart speakers to the cloud, the data includes a redetermined portion of the digital audio file;

searching the cloud for at least one equalizer setting associated with the digital audio file;

retrieving data that includes at least one equalizer setting associated with the digital audio file; and communicating data to at least one smart speaker.

16. The computer-readable medium as claimed in claim 15 further comprising a program, which, when executed by one or more processors performs an operation comprising:

communicating a song genre from a controller application that is in communication with at least one smart speaker in the plurality of smart speakers to in the data being communicated to the cloud;

retrieving data that includes at least one equalizer setting associated with the song genre from the cloud; and communicating the data including the at least one equalizer setting to at least one smart speaker.

17. The computer-readable medium as claimed in claim 15 further comprising a program, which, when executed by one or more processors performs an operation comprising:

communicating a song title and t predetermined portion of the digital audio file in the data being communicated to the cloud;

analyzing, in the cloud, the song title and the predetermined portion of the digital audio file to match a song genre with the digital audio file being played by at least one smart speaker;

retrieving data that includes at least one equalizer setting associated with the song genre; and communicating data to at least one smart speaker.

18. The computer-readable medium as claimed in claim 15 further comprising a program, which, when executed by one or more processors performs an operation comprising:

storing listener preferences in the cloud; and searching the cloud for at least one equalizer setting associated with the digital audio file and stored listener preferences.

19. The computer-readable medium as claimed in claim 15 wherein the data being communicated to the cloud further comprises a genre of music, a song title, an artist, a time of day, a volume, listener preferences for at least one equalizer setting, or profile data associated with at least one listener, and further comprises a program, which when executed by one or more processors performs an operation comprising:

analyzing the data in the cloud to determine suggestions for the at least one listener; and sending the suggestions from the cloud to at least one of the plurality of smart speakers.

20. The computer readable medium as claimed in claim 19 wherein analyzing the data in the cloud to determine suggestions for the at least one listener further comprises data communicated from one or more listeners that are known to each other.

* * * * *